United States Patent [19]

Gatos et al.

[11] 4,186,045

[45] Jan. 29, 1980

[54] METHOD OF EPITAXIAL GROWTH EMPLOYING ELECTROMIGRATION

[75] Inventors: Harry C. Gatos, Weston; Lubomir L. Jastrzebski, Somerville, both of Mass.

[73] Assignee: Massachusetts Institute of Technology, Cambridge, Mass.

[21] Appl. No.: 846,651

[22] Filed: Oct. 28, 1977

Related U.S. Application Data

[63] Continuation-in-part of Ser. No. 717,828, Aug. 26, 1976, abandoned.

[51] Int. Cl.² ............................................. B01J 17/04
[52] U.S. Cl. .................................. 156/602; 156/624; 204/39; 427/86
[58] Field of Search ............... 156/602, 605, 624, 622, 156/621; 204/14 N, 39, 193; 427/82, 85, 86, 87

[56] References Cited

U.S. PATENT DOCUMENTS

| 2,842,467 | 7/1958 | Landauer | 156/602 |
| 3,086,857 | 4/1963 | Pfann | 156/602 |
| 3,411,946 | 11/1968 | Tramposch | 156/602 |
| 3,600,294 | 8/1971 | Rubin | 156/602 |
| 3,879,235 | 4/1975 | Gatos | 148/171 |
| 4,012,242 | 3/1977 | Matare | 156/602 |

OTHER PUBLICATIONS

Research, C&EN, Aug. 11, 1969, pp. 32–33.
Jastrzebski, J. of Electrochem. Soc., Jul. 1976, pp. 1121–1122.
Lawrence, J. of Crystal Growth, 30, 1975, pp. 267–275.
Kimagawa et al., J. Electrochem. Soc.Solid–State Sci. & Tech., Apr. 1973, pp. 583–584.
Lichtensteiger, J. Electrochem. Soc. Solid State Science, Jun. 1971, pp. 1013–1014.

*Primary Examiner*—Hiram H. Bernstein
*Attorney, Agent, or Firm*—Arthur A. Smith, Jr.; Robert Shaw

[57] ABSTRACT

A method of liquid phase epitaxial (LPE) growth of, for example, a semiconductor material or an oxide material whereby growth upon a seed in a seed-solution system is affected by passing electric current in an appropriate direction to effect migration of the materials to the growth interface or away from the interface and then cause deposition of desired materials upon said growth interface.

24 Claims, 12 Drawing Figures

METHOD OF EPITAXIAL GROWTH EMPLOYING ELECTROMIGRATION

The Government has rights in this invention pursuant to Grant No. K43136 and Institutional Patent Agreement No. 0010, awarded by the National Science Foundation.

This is a continuation-in-part of an application Ser. No. 717,828 filed Aug. 26, 1976 now abandoned by the present inventors.

The present invention relates to liquid phase epitaxial growth (LPE) wherein a mass migration of material to-be-deposited is effected by electromigration of said materials.

By way of background, attention is called to U.S. Pat. No. 3,879,235 (Gatos et al) and to the art therein cited, to a journal article entitled "Electromigration in Current-Controlled LPE" (Jastrzebski et al.), *J. Electrochem Soc: Solid-State Science and Technology*, July 1975, pp. 1121–1122, and to a further journal article entitled "Current-Induced Solution Growth of Garnet Layers" (Jastrzebski et al.), *J. Electrochem Soc: Solid State Science and Technology*, April 1977, pp. 633–634.

The work described in the Gatos et al U.S. Pat. No. (3,879,235) is concerned with epitaxial growth using Peltier cooling at the solution-substrate interface. The substrates used in the work described in the patent were at least two millimeters thick. The present inventors have found that with such substrate in the growth system therein disclosed in the patent, the major effect in growth is, in fact, Peltier cooling. Electromigration need not be a significant factor in the growth system of the Gatos et al patent and, indeed, there is no express teaching of electromigration in that patent.

Underlying and forming the basis of the present invention is the discovery that in the systems described herein electromigration is the major mechanism by which growth occurs in the LPE growth process described and that heretofore unattainable growth rates, crystal integrity, and so forth, are available over a wide range of materials. (The present growth system is sometimes referred to as "electroepitaxy" herein.)

Accordingly, an object of the present invention is to provide a new process for liquid phase epitaxial growth, that employs electromigration of constituents in the growth process.

Another object is to provide a new process for growing semiconductive crystals from III–V compounds, II–IV compounds and II–VI compounds.

Still another object is to provide a new process for growing oxides.

A further object is to provide a new growth system for compounds such as mixed ternary and quatranary systems.

These and still further objects are addressed hereinafter.

The foregoing objects are achieved in a method of epitaxial growth of a material wherein the substances from which the material is formed are subjected to a high temperature to create a liquid solution that includes the constituents of the material. A substrate is brought in contact with the solution and then an electric current is created in the solution in an appropriate direction to effect electromigration of the solute portion of the solution, or the solvent portion thereof, or both, to establish in the vicinity of the interface between the solution and the substrate a supersaturated solution of said constituents which precipitate on the substrate at said interface by virtue of the condition of supersaturation and effect epitaxial growth thereon.

The invention is hereinafter discussed with reference to the accompanying drawing in which.

Before going into a detailed discussion of the invention, some overall comments are in order. The growth system herein disclosed is one in which liquid phase epitaxial growth of a material occurs. Epitaxial growth, as is well known, is growth from a solution upon a seed or substrate and occurs by precipitation of the constituents of the material upon the seed or substrate at the interface therebetween. In the usual system, the solution is maintained at about the saturation temperatures and slight cooling at the seed-solution interface occurs, causing said precipitation. In the Gatos et al patent above discussed, cooling at the seed-solution interface is effected by Peltier cooling. While in some cases, as later discussed, in the present system Peltier cooling can be a factor (a controllable factor in these teachings), it is electromigration which is either substantially totally responsible for growth or mostly responsible for such growth. It should be emphasized here that even though an electric field is employed within the solution, such field is used merely to effect mass migration of solute, or of solvent, or of both solute and solvent; the growth is epitaxial, i.e., by precipitation of constituents of the material grown upon the seed and is due to supersaturation of the solution in the vicinity of the interface. There is little or no electric current flow in the system by virtue of the actual precipitation. Hence, the present system is not an electrodeposition effect.

Figure 3:
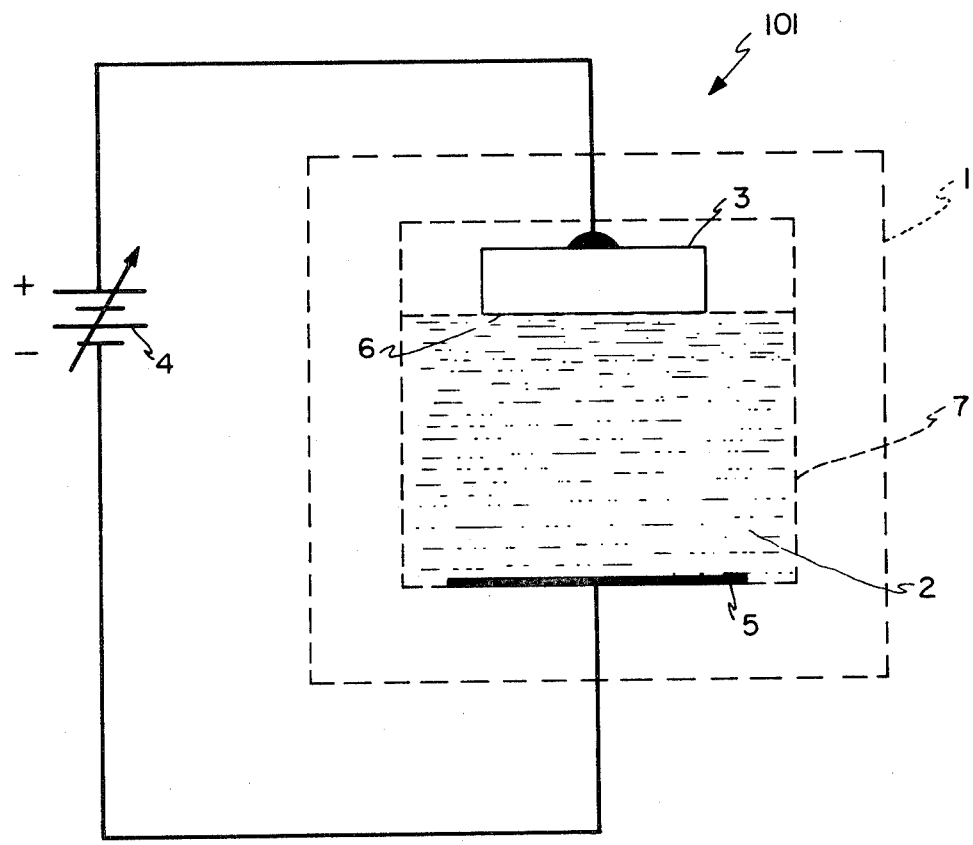
FIG. 3 is a schematic representation of a system for effecting liquid phase epitaxial growth of constituents upon a seed material in an oxide growth system, employing electromigration to affect the rate of such growth.

In later paragraphs, FIG. 3 is discussed in connection with growth of a particular material. In this paragraph FIG. 3 is used to explain the present invention in more general terms. Specifically, in FIG. 3 the numeral 2 designates a solution which is typically kept at or near saturation, a seed 3 is shown in contact with the solution 2, and the seed-solution interface is labeled 6. An electric field is applied within the solution 2 to effect electromigration of the substances that constitute the solution. The effect of such electromigration is to achieve supersaturation at the region of the solution at and near the interface 6; said another way, the electromigration serves to supersaturate said region with the constituents of the material grown and said constituents precipitate on the seed at the interface 6 by virtue of the condition of supersaturation and effect of epitaxial growth thereon. Supersaturation can come about by virtue of mass migration of the solvent or the solute or both toward or away from the interface, with the rate of mass migration of one substance in the solution differing from the rate of mass migration of another substance therein to affect the condition of saturation in and around the interface 6.

The electromigration process herein described is useful in the growth of semiconductor materials and oxides, the latter being insulators at room temperature. In the examples given later, Example 1 relates to a semiconductor material and Example 2 to an oxide material.

Turning now to FIG. 3, the system labeled 101 is adapted to effect liquid phase epitaxial growth in process or method that employs electromigration; the system 101 uses the top seed method and the ultimate material grown is crystalline (i.e., monocrystalline or polycrystalline). For purposes of the description, let it be assumed that the crystal grown is the yttrium iron-gallium garnet of Example 2 hereinafter. In the system of Example 2, layers of $Y_3Fe_{5-x}Ga_xO_{12}$ are grown from solution in which the flux or solvent is $BaO-BF_2-B_2O_3$ and the solute is $Y_2O_3-Fe_2O_3-Ga_2O_3$.

The substances from which a material is grown are disposed in a container 7; the substances include the constituents of the material to be grown. The block labeled 1 in FIG. 3 is a furnace which serves to bring the temperature of said constituents within the container 7 to a high enough temperature to create the solution which is at or near saturation without any electric current passing therethrough. A seed or substrate is brought in contact with the solution. Thereafter an electric current from a variable-voltage dc source 4 is passed between an electrode 5 and the seed 3 through the solution 2 in an appropriate direction to effect migration of constituents relative to the growth interface 6 between the substrate and the solution. In this way, the solution in the immediate vicinity of the interface 6 becomes supersaturated and precipitation upon the seed occurs at a rate which is a function of the degree of supersaturation, and the degree of supersaturation is a function of the electric field in the solution between the electrode 5 and the seed 3; said another way, the precipitation is affected by mass migration of charge particles in the solution by virtue of said electric field.

According to the method of the invention the material is epitaxially grown by maintaining the liquid solution at a high temperature which is about the saturation temperature of the solution prior to any electromigration. The electromigration creates within the solute boundary layer adjacent to the solution-substrate interface a concentration of solute greater than the concentration of solute in the remainder of the solution and hence effects super-saturation at the interface. In this embodiment of the invention the substrate has a thickness of less than about 300 microns.

EXAMPLE 1

Figure 1:
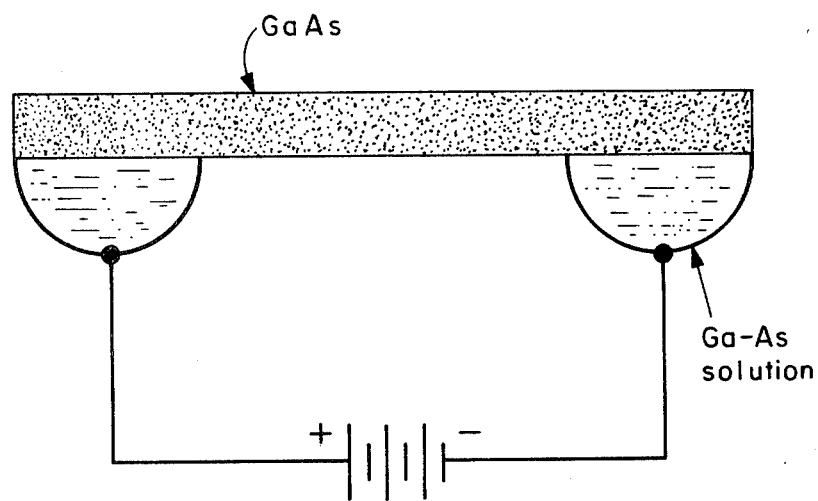
FIG. 1 is a schematic diagram of an experimental arrangement to study electromigration in III–V compounds.
Figure 2:
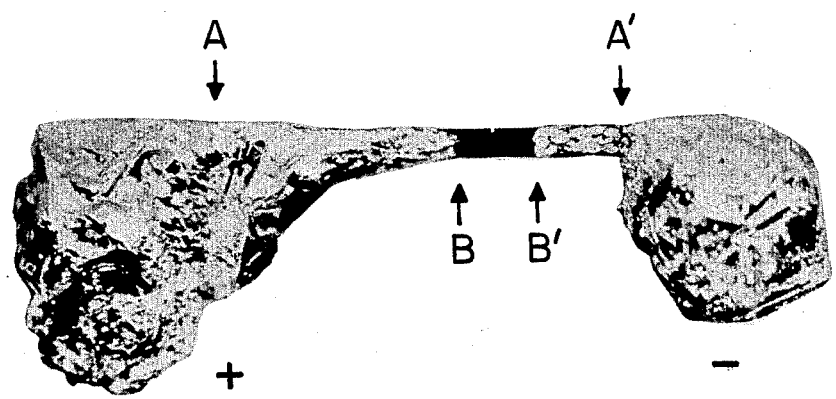
FIG. 2 is a photomicrograph showing actual experimental results.

To demonstrate the electromigration of As and Ga the following experiment was performed. A GaAs wafer was brought into contact with Ga-As solution, in equilibrium at 850° C., contained in two wells as shown schematically in FIG. 1. (Although experimental data here in Example 1 was obtained in a system as depicted in FIG. 1, the system used for growing GaAs in accordance with the present teaching is that shown in FIG. 5 and described later.) The system of FIG. 1 was allowed to equilibrate for 30 minutes and then current was passed. The result obtained with a p-type (Zn doped $2\times10^{18}/cm^3$) GaAs wafer ($1\times0.18\times0.03$ cm) after passing current (0.5 A/cm$^2$) for 40 seconds in a hydrogen atmosphere is shown in FIG. 2. The solidified melts are attached to the ends of the wafer. It is seen that migration of the solution took place along the surface of the wafer up to regions B and B' in the figure. Electron microphobe analysis showed that the concentration of As in the solution on the wafer near B' was more than 50% higher than on the surface near B. Apparently electromigration of charged As and Ga species causes the observed migration of the solution; no solution migration was obtained in the absence of an electric current. The distance of migration on the wafer was found to increase linearly with time and with electric field. Accordingly, effective mobilities for Ga (migrating to the negative end of the wafer) and for As (migrating to the positive end) were calculated to be $2\times10^{-2}$ and $7\times10^{-3}$ cm$^2$/V sec, respectively. These mobility values are believed to be smaller than in the LPE process, since surface tension is acting against solution migration in the experimental arrangement of FIG. 1.

On the basis of the Verhoeven analysis for electromigration in metallic melts, the growth rate during current-controlled LPE was estimated. Since the contribution of diffusion and the movement of the growth interface can be neglected, the flux of As, toward the interface is $$J_{As}=C_{As}C_{Ga}\overline{V}_{Ga}UE$$

where $C_{As}$ is the concentration of As in the melt (0.0235), $C_{Ga}$ is the concentration of Ga, $\overline{V}_{Ga}$ is the partial molar volume of Ga (in the present case $C_{Ga}\overline{V}_{Ga}\simeq1$), U is the difference in mobilities $v_{Ga}-v_{As}$ (taken from the present experiments $\sim2.7\times10^{-2}$ cm$^2$/V-sec) and E is the electric field ($10^{-3}$ V/cm); E was calculated for the current density (10 A/cm$^2$), the dimensions of the solution and the resistivity of the solution which was taken as $10^{-4}$ ohm-cm assuming a linear increase with temperature from its value of $2.6\times10^{-5}$ ohm-cm at 30° C. On the basis of the above relationship, and assuming no nucleation of GaAs in the melt, a growth rate of ~8×10⁻¹ μm/min is obtained; this value is in good agreement with the experimentally determined values of 4 to 7×10⁻¹ μm/min.

The above experiments were also carried out employing In-Sb solutions (25 atom % Sb) and InSb substrates at 450° C. The results were consistent with those obtained for the GaAs system. (The mobilities of In and Sb were estimated to be $3 \times 10^{-3}$ and $0.6 \times 10^{-3}$ cm²/V sec, respectively.)

Figure 5:
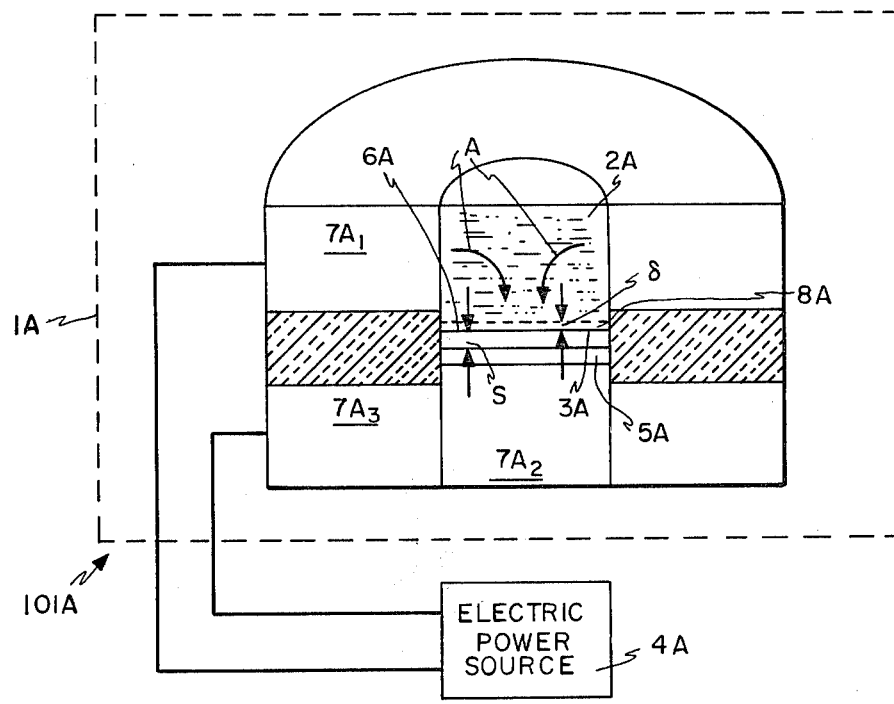
FIG. 5 is a schematic representation, a portion of which is an isometric section view, of a system similar to that of FIG. 3, but one used to effect growth of GaAs.

The electroepitaxial growth of GaAs as above noted, was actually performed in a system like that shown at 101A in FIG. 5. The system 101A includes a furnace 1A, a solution 2A, a GaAs substrate 3A and a gallium-arsenic solution contact 5A. Electrons, as depicted by arrows A, flow from an electric power source 4A through an annular graphite conductor 7A₁ to the solution 2A, across a solute boundary layer 8A (the solute boundary layer is a layer whose consistency or concentration differs from the consistency or concentration of the remainder or bulk of the solution 2A; its thickness is labeled δ), through the substrate 3A, the contact 5A, a cylindrical graphite conductor 7A₂, a further annular graphite conductor 7A₃ and back to the source 4A. The substrate thickness, which is quite important, is marked S in FIG. 5.

A distinction can be made from the Gatos et al system: due to the use of a thin substrate in the system of FIG. 5 (S is the order of 300 μm thick) Peltier effect was practically eliminated in GaAs growth; measured temperature decrease in the solution 300 μm from the interface was between 0.2°–0.5° C. and there was a significant reduction of convectional flow in the solution during the growth process due to reduction of the thermoelectric effect which occurs during current flow and which is minimized here; as evidence of this, the growth velocity in the present system was found to be independent of the solution height for a range of heights between 0.2 and 1.2 cm (which is not the case if convection is present). Growth velocity obtained during the electroepitaxial process in the present system was found to be an order of magnitude too big to be explained by Peltier effect and thickness of the growth layers was about forty times bigger than that which could be expected for Peltier effect. Obtained results can be explained on the basis of electromigration. In the system of FIG. 5, As migrates under the influence of the electric field toward the interface 6A and Ga migrates away from the interface; due to the migration, the ratio As/Ga increases in the region of the interface 6A so that supersaturation occurs there and GaAs precipitates upon the interface.

Figure 6:
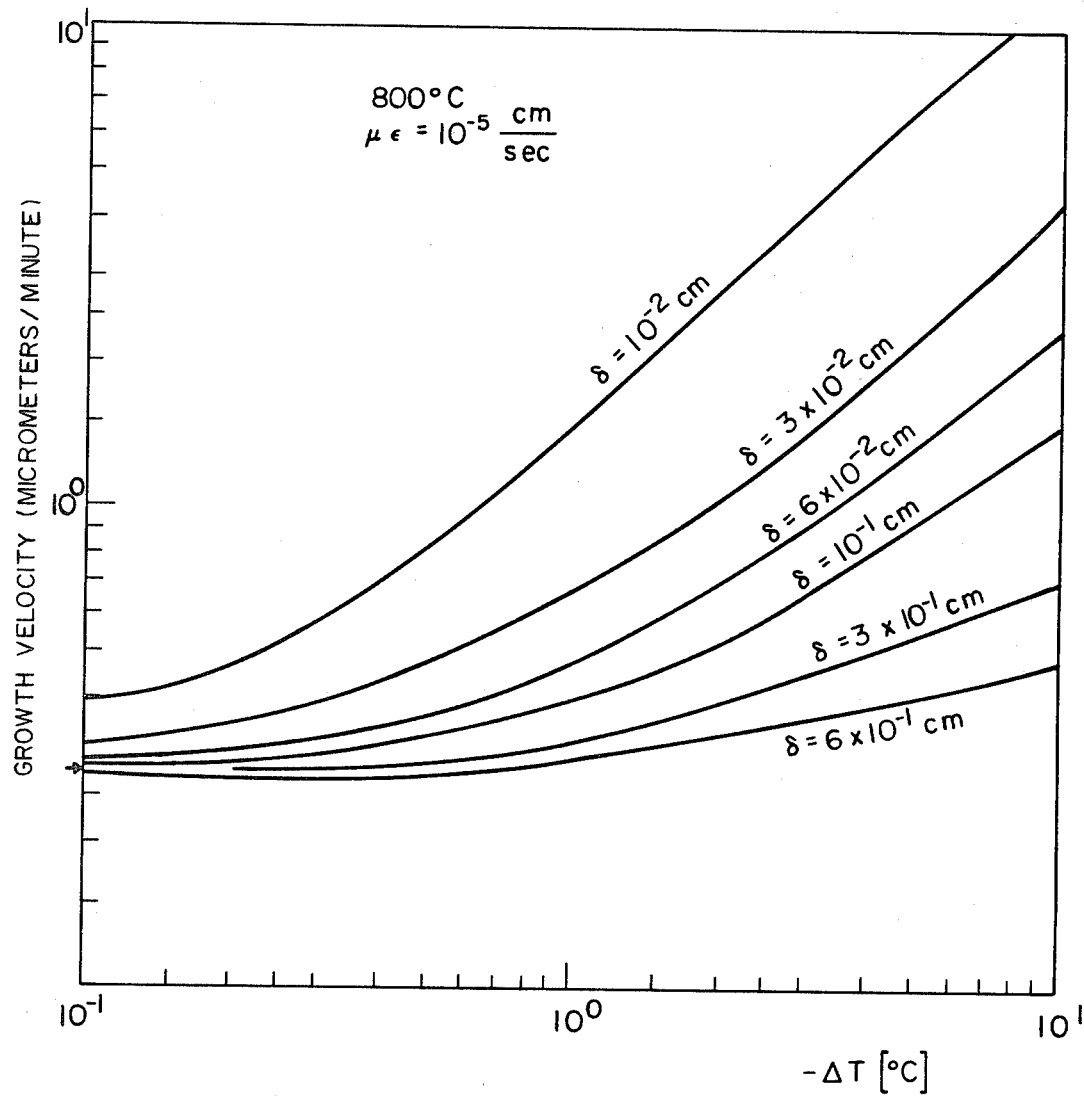
FIG. 6 is a graph of the growth velocity in a GaAs system at 800° C. for ten A/cm$^2$ current ($\mu E \approx 10^{-5}$ cm/sec) as a function of Peltier cooling wherein the parameter $\delta$ in centimeters is the solute-boundary layer thickness in the solution, the arrow in the figure (at ~0.28 micrometer/minute) indicating the growth velocity due to electromigration alone.
Figure 7:
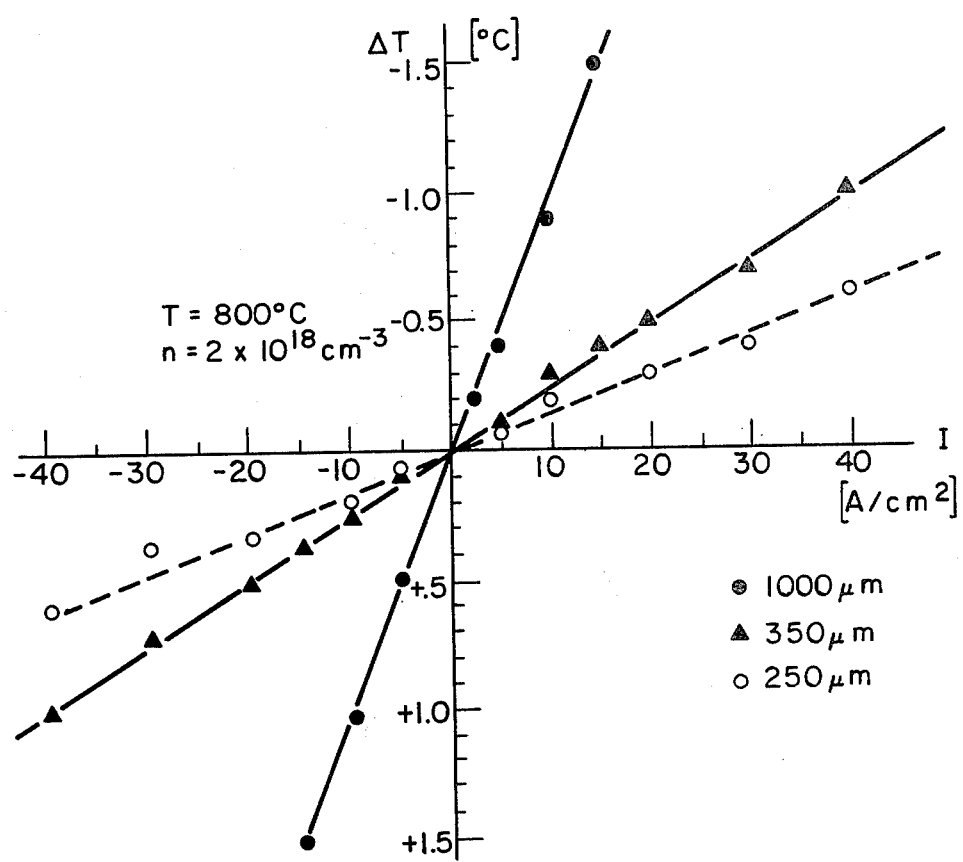
FIG. 7 is a graph of the value of Peltier cooling ($\Delta T$) as a function of current density for three different substrate thicknesses for a GaAs system at 800° C., the substrate being at positive polarity with respect to the solution for the data shown.
Figure 8:
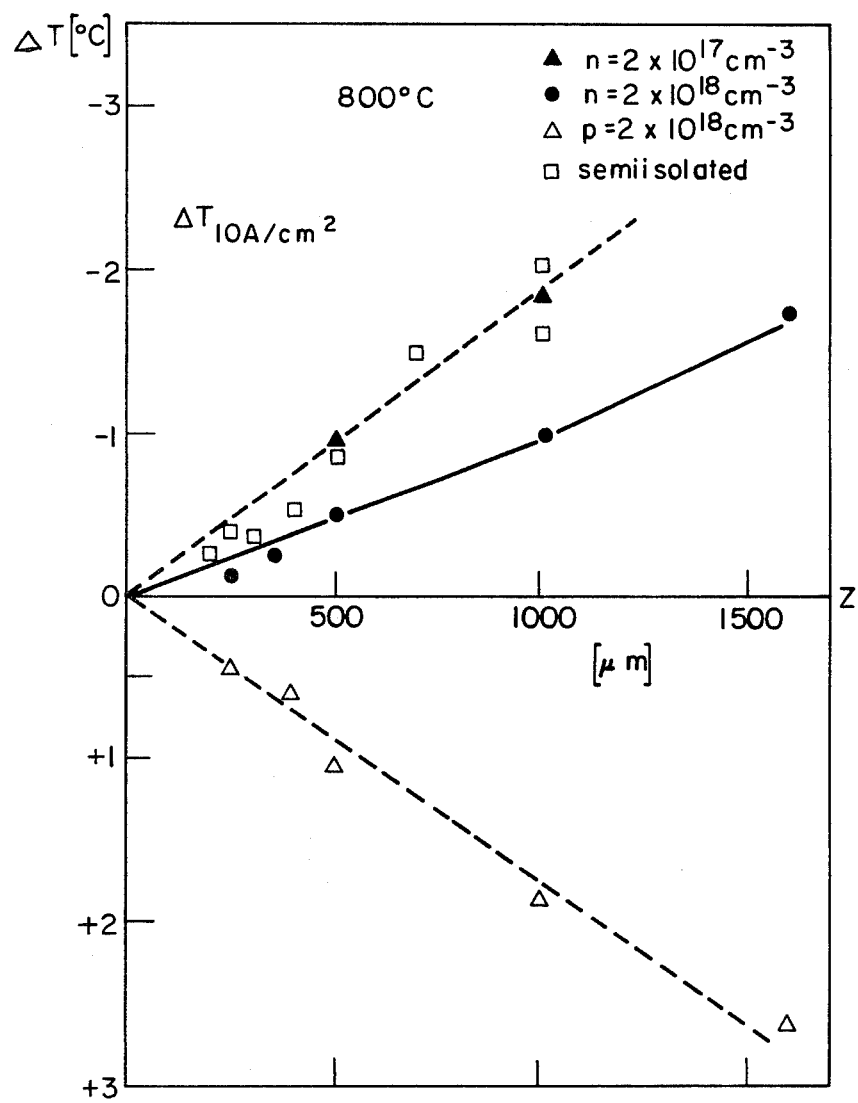
FIG. 8 is a graph of the value of Peltier cooling ($\Delta T$) for ten A/cm$^2$ current as a function of substrate thickness for four different carrier concentrations in the substrate for a GaAs system at 800° C.
Figure 9:
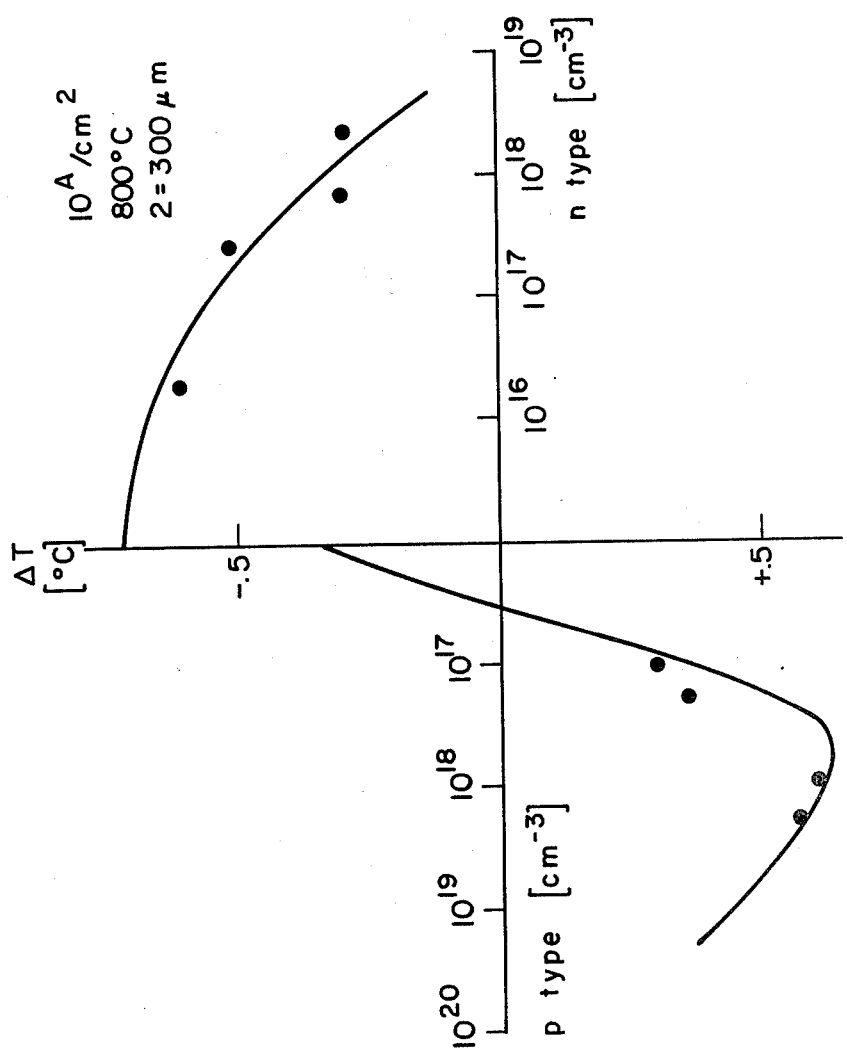
FIG. 9 is a graph showing the value of Peltier cooling ($\Delta T$) for ten A/cm$^2$ current as a function of carrier concentration in the substrate at room temperature for a substrate 300 $\mu$m thick at 800° C.

It was shown for present purposes that in the type of system described in FIG. 5, electromigration rather than Peltier cooling is the controlling factor in the electroepitaxial growth. To distinguish the region (area) of work in which one effect or another dominates growth, the value of growth velocity v as a function of temperature decreases due to Peltier cooling ΔT for different thickness value δ (in centimeters) of the solute boundary layer in the solution is presented in FIG. 6; the solute boundary layer is created by mixing that occurs because of thermal gradients in the solution caused by any thermoelectric effect, including Peltier effect. Growth velocity obtained for electromigration alone is marked by the arrow along the ordinate in FIG. 6. It is important to notice that value of ΔT in FIG. 6 depends on the thickness of the substrates used, carrier concentration in the substrate, and the current density; FIGS. 9, 8, and 7, respectively, present Peltier cooling ΔT as a function of these variables. The Peltier effect contribution to growth increases as convectional flow in the solution 2A increases, said conventional flow being caused by thermal gradients within the solution. In any event, in accordance with the present teaching, electromigration occurs from or to the bulk of the solution and through the solute boundary layer to create the condition of supersaturation herein discussed and precipitation occurs from the solute boundary layer immediately adjacent the substrate interface upon that interface. Peltier effect, of course, can occur only in cases where the materials involved exhibit the requisite Peltier characteristics. The materials in EXHIBIT 1 fit this description, but those of EXAMPLE 2 do no; so Peltier cooling has no relevance as to EXAMPLE 2.

EXAMPLE 2

Yttrium iron-gallium garnet layers were grown thermally on single crystal YIG and GGG substrates from a BaO—BaF₂—B₂O₃ solution by applying an electric current across the seed solution interface. The growth rate and composition were found to depend strongly on the current density. Growth is brought about by electromigration of charged species to the crystal-solution interface; the growth is $Y_3Fe_{5-x}Ga_xO_{12}$ layers.

Figure 4:
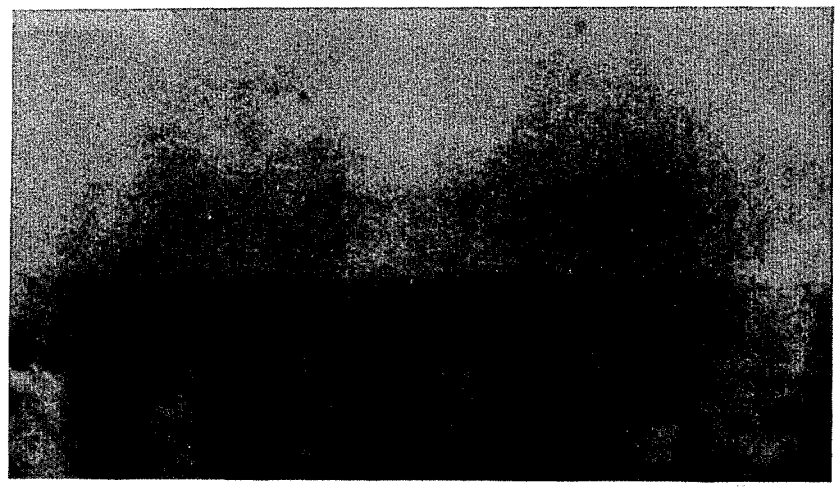
FIG. 4 is a photomicrograph of an oxide layer grown on a YIG substrate.

All experiments were carried out, without substrate rotation, in a standard apparatus for epitaxial growth of garnets from solution (apparatus like that of FIG. 3 was used); electrical contacts (with Pt) were made to the seed and the crucible. A 25% solution of oxides (37.5% Y₂O₃ + 52.1% Fe₂O₃ + 10.4% Ga₂O₃) in 41% BaO + 18% BaF₂ + 41% B₂O₃ was used; the seeds were single crystals of GGG with (111) orientation and YIG with a high index orientation. Growth was carried out at 1195° C. (the equilibrium temperature is 1190° C.) employing current densities of 10⁻⁴ to 2 A/cm²; the polarity of the seed was positive. With the electrical contacts connected to the power supply, growth was initiated by immersing the seed into the solution and terminated by withdrawing the seed while the system was at the growth temperature of 1195° C. With the above current densities, layers of $Y_3Fe_{5-x}Ga_xO_{12}$ were obtained ranging in thickness from 8 to 800 μm. The flux attached to the grown layer was removed with dilute (50%) HCl and the average thickness of the layer was determined by measuring the weight gain of the seed and optically by employing a cross-section of the seed with the epitaxial layer. The grown layers were monocrystalline with inclusions identified as flux; see FIG. 4.

The average growth rate as a function of current density is shown in said further journal article. The normalized growth rate (growth velocity/current density) decreases with increasing current density; i.e., the growth efficiency decreases with increasing current density. The composition of the grown layers (determined by an electron microphobe) is a function of current density. The Ga concentration increases significantly with increasing current density. The lattice parameter of a layer grown at 0.5 A/cm² was found to be 12.360 Å, which corresponds to the composition $Y_3Fe_4GaO_{12}$. The composition of a thermally grown layer from the same solution (by decreasing the temperature 8° C. below the equilibrium temperature) was found to be $Y_3Fe_{4.3}Ga_{0.7}O_{12}$ and the average growth rate 0.5 μm/min.

A quantitative interpretation of the experimental results is not possible since there is no detailed information available on the type of the species present in the solution, their charge and their mobility. However, a qualitative explanation will be presented. During current flow negatively charged yttrium, iron and gallium oxide species migrate toward the seed (positive) and positively charged boric oxide species migrate away from the seed. Thus, the solution becomes supersaturated at the seed-solution interface and growth takes place. The negative charge of the above three oxide species probably results from associated with $F^-$, whereas the positive charge of the boric oxide results from association with $Ba^{++}$. Apparently, the relatively high charge of these species and the relatively high resistance of the solution (of the order of one ohm) are responsible for the fact that, for a current density of 1 A/cm², the growth rate of garnets is about three orders of magnitude higher than that reported for GaAs where the resistance of the solution is about $10^{-4}$ ohms.

The increase in the gallium concentration with increasing current density noted above and shown in said further journal article, is attributed to the higher mobility of the charged gallium species as compared to that of the yttrium and iron species. The observed decrease of the normalized growth velocity with increasing current density is believed to be associated with the increase in concentration of BaO and BaF₂ (with increasing current density) at the seed solution interface. Actually, at current densities greater than 10 A/cm², seed dissolution took place rather than crystal growth. At this current density a (positive) platinum electrode, used in the place of the seed, was attached by the solution, apparently because the solution became depleted in boric acid which migrated to the opposite electrode; this type of platinum attack has been reported for solutions rich in BaO and BaF₂.

Current-induced solution growth of garnet layers was achieved. The growth velocity and composition were found to depend strongly on current density. This dependence is qualitatively consistent with migration of charged species during current flow. The growth materials described above are crystalline, but the teaching applies also to amorphous films.

Listed below are further examples of materials that can be used in the growth process herein described: Examples 1-11 are oxides, 12-15 are semiconductors or semimetals, and 16-18 are additional compounds.
(1) PbMoO₄ or Pb₂MoO₅ from PbO flux.
(2) Gd₃Ga₅₋ₓ₋ᵧMgₓZrᵧO₁₂ from PbO flux.
(3) Lead germinates: e.g., Pb₅Ge₃O₁₁ from PbO—GeO₂ flux.
(4) Teta alumine (NaO 6-g Al₂O₃) Na₂O—Ga₂O₅ flux.
(5) Nd₁₋ₓYₓP₅O₁₅ from phosphoric acid flux.
(6) Rutile type crystals from type of Na₂B₄O₇ flux.
(7) Type of β-LiAlSiO₄ crystals from flux, e.g., LiF—AlF₃.
(8) Beryllia type (BeO crystals) from flux: e.g., alkali polymolybdate.
(9) Corundum type crystal from cryolite (Na₃AlF₆) flux.
(10) LiFe₅O₈ from, e.g., PbO, PbF₂, B₂O₃ flux.
(11) Crystal such as garnets, orthoferrites, spinels and magnetoplumbites.
E.g.,

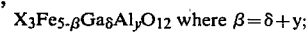

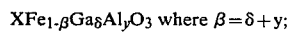

where X is rare earth or possible combination of the different kinds of rare earth mixtures.

(12) $A^{III}B^V$ compounds (whether mixed or not) from Ga, In or mixed Ga and In or other solutions, e.g.:

where $$x+y+z=1$$

$$\alpha+\beta+\gamma=1.$$

(13) $A^{II}B^{VI}$ compounds (whether mixed or not) from Hg or other solutions, e.g.:
$Hg_xCd_xZn_zTe_\alpha Se_\beta S_\gamma$ where $$z+x+y=1$$

$$\alpha+\beta+\gamma=1.$$

(14) $A^{IV}B^{VI}$ compounds (whether mixed or not) from Pb or Sn or mixed Pb and Sn or other solutions, e.g.:

$Cd_zSn_xPb_yTe_\alpha Se_\beta S_\gamma$ where $$z+x+y=1$$

$$\alpha+\beta+\gamma=1.$$

(15) $A^{III}B^{VI}$ compounds from Sn or other flux, e.g.:

$Al_y In_\alpha Ga_\beta S_x Se_y Te_z$ where $$\gamma+\alpha+\beta=1$$

$$x+y+z=1.$$

(16) Compound type

NiP₂, CuP₂, RhP₃, CuP₂ from Sn solution flux.

(17) Metal transition phosphorites type M₂P from Sn flux where

M-Fe, Co, Ni.

(18) Neodynium chlorapitite from flux, e.g., lead oxide, lead chlorite.

Figure 10:
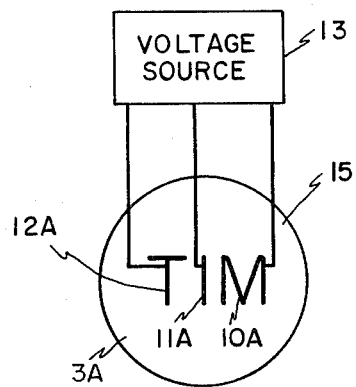
FIG. 10 is a schematic representation, partly block diagram in form, showing a plan view of a substrate upon whose major surface there are disposed three electrical contacts.
Figure 11:
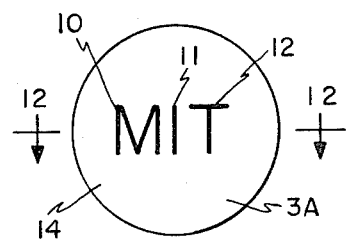
FIG. 11 is a plan view of the opposite major surface of the substrate of FIG. 10, showing growths, provided in accordance with the present teachings, that are mirror images of the electrodes of FIG. 10.
Figure 12:
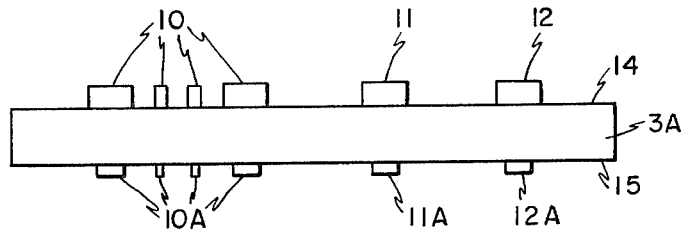
FIG. 12 is a view taken upon the line 12—12 of FIG. 11, looking in the direction of the arrows.

FIGS. 10, 11 and 12 show a substrate 3A (for example, an oxide, e.g., GGG or YIG or a semiconductor, e.g., GaAs) on which there is grown, on the front or growth side 14 thereof, the letters MIT of, say, the materials herein disclosed, the letters being designated 10, 11, and 12 in FIGS. 11 and 12. To accomplish such growth, the substrate 3A has at the obverse or back side 15 thereof, electrical contacts 10A, 11A and 12A that correspond respectively to the letters MIT on the front side and shaped in the mirror image of said letters. Placed in the context of FIG. 3 or 5 the front or growth surface 14 of the wafer or disc 3A is placed in contact with the solution 2; a variable voltage source 13 is connected to apply an electric potential to the electrical contacts 10A–12A; and an electric field is established in the solution 2 to cause electromigration, as before. In the systems discussed in this paragraph the parameters of the system, including the magnitude of the electric potential applied to the contacts 10A–12A, the temperature of the solution, and the level of the electromigration field in the solution, are adjusted and maintained at values which cause precipitation, and hence growth, to occur only at and near portions of the front or growth surface 14 directly opposite those portions of the wafer surface 15 in electrical connection with the contacts 10A–12A, as best shown in FIG. 12, that is, the positional coordinates of the letters 10, 11 and 12 correspond to the positional coordinates of the contacts 10A, 11A and 12A, respectively. The electric resistivity of the substrate must be high with respect to the resistivity of the solution.

Further modifications of the invention herein disclosed will occur to persons skilled in the art and all such modifications are deemed to be within the scope of the invention as defined by the appended claims:

What is claimed is:

1. A method of epitaxial growth of a material predominantly by electromigration, that comprises subjecting the substances from which said material is formed to a high temperature to create a liquid solution that includes the constituents of the material;
   bringing a substrate in contact with the solution, there being a solute boundary layer in the solution immediately adjacent the substrate;
   creating an electric field in the solution in an appropriate direction to cause electromigration of at least one of the solute and the solvent that constitute said solution to establish in the solution adjacent the interface between the solution and the substrate a supersaturated solution of said constituents which precipitate on the substrate at said interface by virtue of the condition of supersaturation and effect epitaxial growth thereon;
   establishing and maintaining the parameters of the system at values at which growth is achieved mostly by virtue of said electromigration, said parameters comprising the temperature of the solution, the solute boundary layer thickness in the solution which is kept relatively large by minimizing convection in the solution, the thickness of the substrate and carrier concentration in the substrate, the thickness of the substrate being kept at a value which for the given system, and together with the other parameters of the system, renders the effect of the electromigration dominant and renders the effect of Peltier cooling insignificant; and
   thereby epitaxially growing a layer on said substrate.

2. A method of epitaxial growth of a material as claimed in claim 1 wherein said high temperature is about the saturation temperature of the solution prior to said electromigration, wherein said electromigration creates within the solute boundary layer adjacent to the interface a concentration of solute greater than the concentration of solute in the remainder of the solution and hence effects supersaturation at said interface, and wherein said substrate has a thickness of less than about 300 micrometers.

3. A method of epitaxial growth of a material as claimed in claim 1 wherein said substances are solids at room temperature, wherein said high temperature creates a liquid melt solution therefrom and wherein mixing occurs by virtue of thermal gradients in the liquid-melt solution caused by temperature differences therein, creating said solute boundary layer in the region of the solution near the interface, said solute boundary layer having a concentration of solute different from the concentration of solute in the bulk of the solution, said electromigration occurring between the bulk of the solution and the solute boundary layer to produce said condition of supersaturation that is, an excess of solute, in the solute boundary immediately adjacent the interface.

4. A method as claimed in claim 1 that further includes adjusting the magnitude of electric field to change the amount or rate of electrical migration to control the growth velocity an composition profile and the impurity profile of the grown material.

5. A method as claimed in claim 1 wherein said constituents comprise group III–V compounds and mixtures thereof.

6. A method as claimed in claim 5 wherein said compounds are taken from the group consisting essentially of GaAs, InSb, InAs, GaP and mixtures thereof.

7. A method as claimed in claim 1 wherein said constituents are electrically insulating at room temperature and wherein said material is an oxide.

8. A method of epitaxial growth as defined by claim 1 of an oxide material, that comprises subjecting the substances from which said material is formed to a high temperature to create a solution in which at least one of the solute and the solvent includes constituents of said material, said substances being electrically insulating solids at room temperature;
   bringing a substrate in contact with the solution; and
   creating an electric field in the solution in an appropriate direction to cause electromigration of at least one of said solute and said solvent toward the interface region between the solution and the substrate or away from said region, said constituents at said region by virtue of said electromigration being present in sufficient quantity to establish a supersaturated solution of said constituents at said region, which constituents precipitate on the substrate at said interface and effect epitaxial growth thereon.

9. A method of epitaxial growth of a material as claimed in claim 8 wherein said high temperature is sufficiently high to melt the solid substances and to create a liquid solution therefrom, said high temperature being about the saturation temperature of the solution prior to said electromigration.

10. A method of epitaxial growth of a material as claimed in claim 9 which includes changing the level of the electric field to effect changes in the composition of the grown material.

11. A method of epitaxial growth of a material as claimed in claim 9 in which the substrate is chosen to have a resistivity that is high with respect to the resistivity of the solution, said method further including applying to selected areas on the obverse side of said substrate electrical contacts, and applying an electric potential to said selected areas to cause growth at selected regions of said interface which correspond in positional coordinates to the areas of said contacts.

12. A method as claimed in claim 8 wherein said oxide is a garnet.

13. A method as claimed in claim 12 wherein said garnet is $Y_3Fe_5O_{12}$.

14. A method as claimed in claim 8 wherein said oxide is taken from the group consisting of garnets, orthoferrites, spinels, and magnetoplumbites of the forms $X_3Fe_{5-\beta}Ga_\delta Al_yO_{12}$, where $\beta=\delta+y$ and $XFe_{1-\beta}Ga_\delta Al_yO_3$, where $\beta=\delta+y$ and where X is taken from the group consisting of rare earths and mixtures of rare earths.

15. A method as claimed in claim 8 wherein said oxide is one of the group consisting essentially of: $PbMoO_4$ and $Pb_2MoO_5$ from PbO flux; $Gd_3Ga_{5-x-y}Mg_xZr_yO_{12}$ from PbO flux; lead germinates; teta alumine $(NaO\ 6\text{-}gAl_2O_3)\ Na_2O\text{-}Ga_2O_5$ flux; $Nd_{1-x}Y_xP_5O_{15}$ from phosphoric acid flux; type $\beta$-$LiAlSiO_4$ crystals from flux; beryllia type (BeO crystals) from flux; corundum type crystals from cryolite $(Na_3AlF_6)$ flux; and $LiFe_5O_8$ from PbO, $PbF_2$ and $B_2O_3$ flux.

16. A method as claimed in claim 1 wherein the material is a semiconductor of the form $Ga_xIn_yAl_zAs_\alpha P_\beta Sb_\gamma$, where $$x+y+z=1$$

$$\alpha+\beta+\gamma=1.$$

17. A method as claimed in claim 1 wherein the material grown is a semiconductor of the form: $Hg_xCd_yZn_zTe_\alpha Se_\beta S_\gamma$, where $$z+x+y=1$$

$$\alpha+\beta+\gamma=1.$$

18. A method as claimed in claim 1 where the material grown is a semiconductor of the form: $Cd_zSn_xPb_yTe_\alpha Se_\beta S_\gamma$, where $$z+x+y=1$$

$$\alpha+\beta+\gamma=1.$$

19. A method as claimed in claim 1 in which the material grown is a semiconductor of the form: $Al_\gamma In_\alpha Ga_\beta S_x Se_y Te_z$, where $$\gamma+\alpha+\beta=1$$

$$x+y+z=1.$$

20. A method as claimed in claim 1 wherein the material grown is the compound $NiP_2$, $CuP_2$, $RhP_3$, $CuP_2$ from Sn solution flux.

21. A method as claimed in claim 1 wherein the material grown is a metal transition phosphide of the type $M_2P$ from Sn flux, where M is taken from the group consisting of Fe, Co and Ni.

22. A method as claimed in claim 1 wherein the material grown is neodynian chlorapitite.

23. A method as claimed in claim 1 in which the substrate is chosen to have a resistivity that is high with respect to the resistivity of the solution and in which selected areas on the obverse side of said substrate have applied thereto electrical contacts, said method further including applying an electric potential to said selected areas to cause growth at selected regions of said interface which correspond in positional coordinates to said selected areas.

24. A method as claimed in claim 1 wherein said growth is at a growth velocity chosen in accordance with the curves of FIG. 6 to provide a growth region in which electromigration dominates in the growth process.

* * * * *